United States Patent
Schmid et al.

(10) Patent No.: US 7,408,972 B2
(45) Date of Patent: Aug. 5, 2008

(54) OPTICALLY PUMPED SEMICONDUCTOR LASER DEVICE

(75) Inventors: Wolfgang Schmid, Deuerling (DE);
Peter Brick, Regensburg (DE); Stephan Lutgen, Regensburg (DE); Tony Albrecht, Bad Abbach (DE); Franz Eberhard, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/579,519

(22) PCT Filed: Nov. 9, 2004

(86) PCT No.: PCT/DE2004/002476

§ 371 (c)(1),
(2), (4) Date: Mar. 23, 2007

(87) PCT Pub. No.: WO2005/048423

PCT Pub. Date: May 26, 2005

(65) Prior Publication Data

US 2007/0201531 A1    Aug. 30, 2007

(30) Foreign Application Priority Data

Nov. 13, 2003 (DE) ............... 103 53 215

(51) Int. Cl.
*H01S 3/091* (2006.01)
*H01S 3/08* (2006.01)

(52) U.S. Cl. .................................. 372/99; 372/70

(58) Field of Classification Search .............. 372/70, 372/92, 93, 97, 98, 99
See application file for complete search history.

(56) References Cited

U.S. PATENT DOCUMENTS

| 6,947,460 B2 * | 9/2005 | Spath et al. ............... 372/43.01 |
| 6,954,479 B2 | 10/2005 | Albrecht et al. |
| 2002/0075935 A1 * | 6/2002 | Clayton ................... 372/75 |

FOREIGN PATENT DOCUMENTS

| DE | 100 26 734 | 12/2001 |
| JP | 7-249824 | 9/1995 |
| WO | WO 01/93386 A1 | 12/2001 |
| WO | WO 02/067393 A1 | 8/2002 |

* cited by examiner

*Primary Examiner*—Armando Rodriguez
(74) *Attorney, Agent, or Firm*—Cohen Pontani Lieberman & Pavane LLP

(57) ABSTRACT

An optically pumped semiconductor laser device having a surface-emitting vertical emission region (1) and at least one monolithically integrated pump radiation source (2) for optically pumping the vertical emission region (1). The semiconductor laser device is distinguished by the fact that the pump radiation enters the vertical emission region (1) in the form of partial bundles of rays of radiation with different radiation directions so that the pump radiation and the fundamental mode of the vertical emission region (1) have an overlap which is suitable for the excitation of this fundamental mode. This device is based on the fact that the fundamental mode of the vertical emission region (1) is preferably excited when the spatial intensity distribution of the pump radiation matches the profile of the fundamental mode.

7 Claims, 3 Drawing Sheets

US 7,408,972 B2

OPTICALLY PUMPED SEMICONDUCTOR LASER DEVICE

RELATED APPLICATIONS

This is a U.S. national stage of application No. PCT/DE2004/002476, filed on 09 Nov. 2004. This patent application claims the priority of German patent application No. 103 53 215.3 filed Nov. 13, 2003, the disclosure content of which is hereby incorporated by reference.

FIELD OF THE INVENTION

The present invention relates to an optically pumped semiconductor laser device having a surface-emitting vertical emission region and at least one monolithically integrated pump radiation source for optically pumping the vertical emission region.

BACKGROUND OF THE INVENTION

Such laser devices are known, for example, from U.S. Pat. No. 6,954,479 B2, the content of which is incorporated in the present description by reference. In the printed documents, surface-emitting semiconductor laser devices are described, the active element of the vertical emission region of which is formed by a quantum well structure which is optically pumped by adjoining edge-emitting semiconductor lasers. Pump radiation source and quantum well structure are epitactically grown on a common substrate. The monolithically integrated arrangement thus produced saves space and can be inexpensively produced. Furthermore, the production process ensures accurate positioning of pump radiation source and vertical emission region with respect to one another.

Optically pumped semiconductor laser devices of said type permit a high output power since the power dissipation sources, resistance losses during the charge carrier injection in the electrical pumping, on the one hand, and optical absorption losses, on the other hand, are spatially separate. At the same time, they exhibit an advantageous round beam profile and not an elliptical or line-shaped beam profile like, for example, an edge-emitting laser.

In particular, a good beam quality is obtained with laser radiation in the fundamental mode $TEM_{00}$ of the vertical emission region.

SUMMARY OF THE INVENTION

It is an object of the present invention, therefore, to create an optically pumped semiconductor laser device having at least one monolithically integrated pump radiation source which emits laser radiation in good beam quality, preferably radiation of the fundamental mode.

This and other objects are attained in accordance with one aspect of the present invention directed to an optically pumped semiconductor laser device having a surface-emitting vertical emission region and at least one monolithically integrated pump radiation source for optically pumping the vertical emission region. At least one pump radiation source is set up and arranged in such a manner that the pump radiation enters the vertical emission region in the form of partial bundles of rays of radiation with different radiation directions so that the pump radiation and the fundamental mode of the vertical emission region have an overlap which is suitable for the excitation of this fundamental mode. A bundle of rays is the spatial totality of rays or beams. Partial bundles of rays (referred to hereafter as "partial bundles") means that at least two bundles exist, each bundle comprising a part of the pump radiation.

A basic concept underlying the solution according to the invention is that radiation of the required fundamental mode of the vertical emission region is emitted particularly when the spatial intensity distribution of the pump radiation in the vertical emission region matches the profile of this fundamental mode. The basic area of the vertical emission region is typically a polygon (quadrangle, hexagon etc.) or a circle. In the fundamental mode, the symmetry of the basic area of the vertical emission region is reflected. To excite the fundamental mode, it is advantageous, therefore, to couple the pump radiation into the vertical emission region in the form of partial bundles of radiation having different radiation directions as a result of which the spatial intensity distribution of the pump radiation can be matched to the profile of the fundamental mode. A type of coupling in which the pump radiation enters the vertical emission region in a converging manner can also be considered as partial bundle of radiation with different radiation directions.

In an embodiment of the semiconductor laser device according to the invention, the partial bundles of radiation come from different pump radiation sources with different main radiation directions. It is particularly preferred in this context that the pump radiation sources are semiconductor laser elements with a closed resonator which encloses the amplifier region. As an alternative, the pump radiation sources can be edge-emitting semiconductor lasers.

In a preferred embodiment, the pump radiation sources have a resonator with at least one curved cavity end facet.

In a further favored embodiment, the pump radiation sources have a resonator having at least one cavity end facet arrangement which consists of two straight cavity end facets which are arranged at right angles to one another. It is particularly preferred if the two cavity end facets are arranged in such a manner that the pump radiation is totally reflected on them in the resonator.

A further embodiment is characterized by the fact that one or more of the pump radiation sources have a folded resonator with two cavity end facets and at least one inner cavity facet. It is also especially preferred if the at least one inner cavity facet is arranged in such a manner that the pump radiation is totally reflected on it in the resonator. The cavity end facets can be broken crystal facets and the inner cavity facets can be etched facets.

In an advantageous development of the invention, the partial bundles of radiation come from a pump radiation source, the radiation of which is conducted through the vertical emission region several times in different directions. One embodiment is that the pump radiation source has a resonator with a cavity end facet which consists of an etched facet parabolically curved in the main radiation direction of the vertical emission region, the vertical emission region being arranged in the focal point of this facet.

As an alternative, the pump radiation source is a semiconductor ring laser. It is preferred that the resonator of the semiconductor ring laser has at least three inner cavity facets. It is particularly preferred that the at least three inner cavity facets are arranged in such a manner that the pump radiation is totally reflected on them in the resonator.

An advantageous development of the semiconductor laser device according to the invention is that the transition from the at least one pump radiation source to the vertical emission region is curved and is distinguished by a change in the index of refraction so that the pump radiation is focused in the vertical emission region.

BRIEF DESCRIPTION OF THE DRAWINGS

Further advantages, advantageous embodiments and developments of the semiconductor laser device are obtained from the exemplary embodiments explained in greater detail in the text which follows in connection with FIGS. 1 to 6, in which.

DETAILED DESCRIPTION OF THE DRAWINGS

The Figures are diagrammatic drawings. In particular, the ratios of dimensions of the elements have not been shown true to scale. Identical or identically acting elements of the various exemplary embodiments are in each case provided with the same reference symbols in the Figures.

Figure 1:
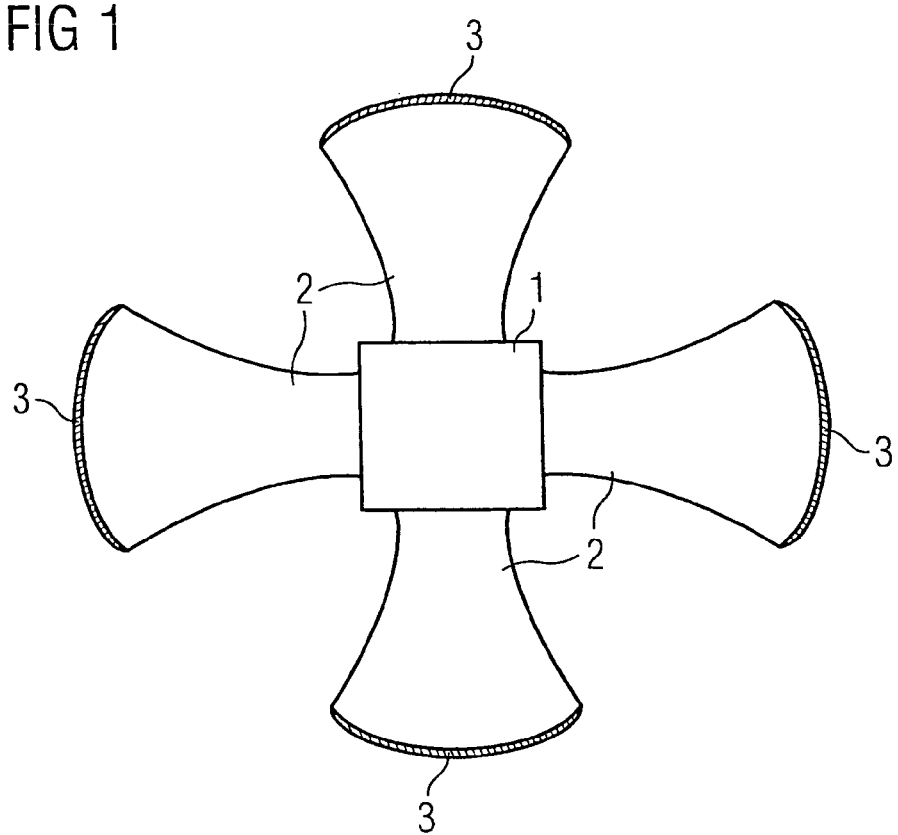
FIG. 1 shows a diagrammatic representation of a top view of a first exemplary embodiment of a semiconductor laser device according to the invention.

The first exemplary embodiment of an optically pumped semiconductor laser device according to the invention, shown diagrammatically in a top view in FIG. 1, has a central vertical emission region 1 and two pump radiation sources 2 intersecting in the vertical emission region 1. The pump radiation sources 2 are bounded by curved cavity end facets 3 towards the outside.

A suitable semiconductor layer sequence for implementing this or one of the other exemplary embodiments of a semiconductor laser device, shown in the context of the present application, can be found, for example, in the above-mentioned U.S. Pat. No. 6,954,479 B2. The vertical emission region 1 can have, for example, quantum well structures as active amplifying regions, the designation quantum well structure comprising any structure in which charge carriers are subjected to a quantization of their energy states due to confinement, in the context of the application. In particular, the designation quantum well structure does not include any information about the dimensionality of the quantization. Thus, it comprises, among other things, quantum troughs, quantum wires and quantum dots and any combination of these structures.

The curved cavity end facets 3 can be produced by an etching process in any shape and with any radius of curvature in the monolithically integrated pump lasers 2. The desired reflectivity can, if necessary, be achieved by applying metallization in a further production process. With suitable shaping of the cavity end facets 3, a laser resonator is thus produced for the pump radiation sources 2 which is distinguished by forming stable pump radiation modes inside the resonator with an ideally Gaussian lateral intensity profile.

Due to the beam guidance in the resonator, the bundles of rays enter the vertical emission region 1 in a convergent manner which results in a concentration of the intensity in the center of the vertical emission region 1. Together with the Gaussian lateral intensity profile of the pump radiation, this results in a spatial distribution of the pump radiation in the vertical emission region 1 which corresponds to the fundamental mode of the vertical emission region 1 in good approximation.

It is advantageous in this context if the absorption coefficient of the pump radiation in the vertical emission region 1 is adjusted in such a manner that the absorption of the pump radiation in the edge region of the vertical emission region 1 is not too high to prevent the pump radiation from propagating into the center of the vertical emission region 1. This absorption coefficient can be matched by suitably choosing the wavelength of the pump radiation compared with the wavelength of the emitted radiation from the vertical emission region 1, which in turn, can be influenced by the composition of the material of the optically active structures in the vertical emission region 1 and the pump radiation sources 2. To achieve good pumping efficiency, the pump radiation has in this case a shorter wavelength than the radiation emitted by the vertical emission region 1.

Figure 2:
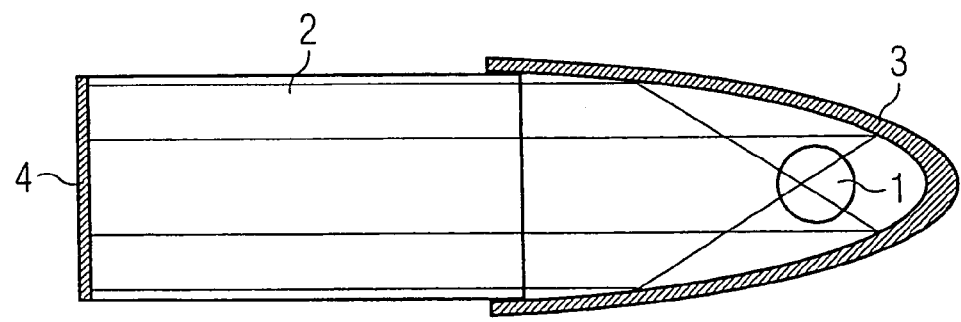
FIG. 2 shows a diagrammatic representation of a top view of a second exemplary embodiment of a semiconductor laser device according to the invention.

In the exemplary embodiment shown in FIG. 2, a pump radiation source 2 is provided which has a straight cavity end facet 4 and a curved cavity end facet 3. The straight cavity end facet 4 is ideally a split crystal facet. The curved cavity end facet 3 is again produced by an etching process. Both facet surfaces can be provided with subsequent metallization. The curved cavity end facet 3 preferably has the form of a parabola, the axis of symmetry of which extends in the direction of the pump radiation source 2 and perpendicularly to the straight cavity end facet 4. In this exemplary embodiment, the area of the vertical emission region 1 is constructed to be round and arranged in the focal point of the parabola. The pump radiation thus enters the vertical emission region 1 homogeneously from all directions. This results in a radially symmetric distribution of the pump radiation intensity in the vertical emission region 1 as a result of which the fundamental mode, which is also radially symmetric, of the vertical emission region 1 is ideally pumped.

Figure 3:
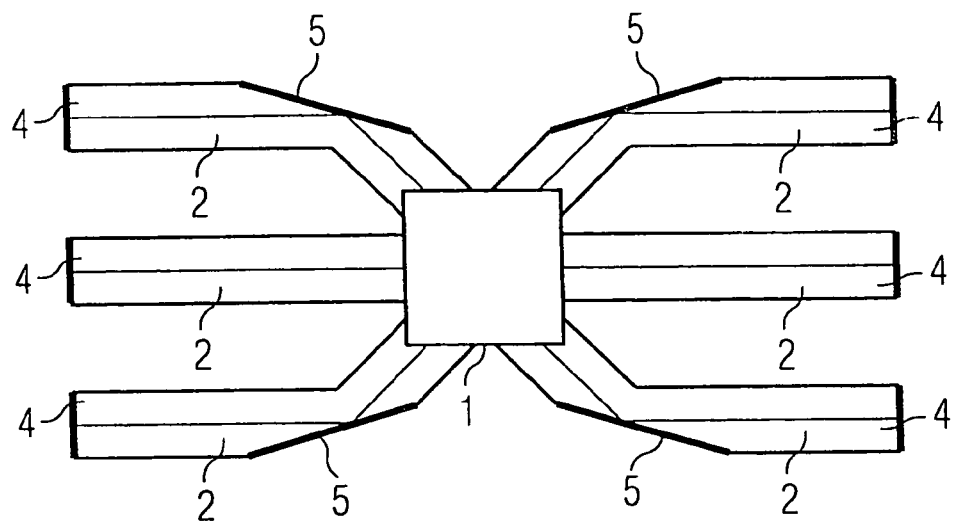
FIG. 3 shows a diagrammatic representation of a top view of a third exemplary embodiment of a semiconductor laser device according to the invention.

In the third exemplary embodiment of a semiconductor laser device according to the invention, shown in FIG. 3, the vertical emission region 1 is surrounded by three pump radiation sources 2 intersecting in this vertical emission region 1. In this arrangement, the center one of the pump radiation sources 2 is distinguished by a linear resonator which is bounded by two straight cavity end facets 4. The two further pump radiation sources 2 are also bounded by two straight cavity end facets 4 each and in addition have two inner cavity facets 5 each.

The arrangement shown in FIG. 3 leads to angles of incidence and of reflection of the radiation inside the resonator at the inner cavity facets 5 of 45°. At the indices of refraction of materials typically used for a semiconductor laser device of the type shown, total reflection already occurs at this angle at the boundary faces of the inner cavity facets 5. The inner cavity facets 5 can be produced, for example, in an etching process, enabling additional metallization for mirror coating to be omitted. The etching process used is preferably a wet or dry chemical etching method. An inert passivation layer e.g. silicon nitride, can be applied as protection for the etched surfaces and for improving the chemical long-term stability of these surfaces. In an especially suitable production process, both the etching and/or the metallization and/or the application of a passivation layer can be performed in the compound wafer. Following that, the semiconductor laser devices are then separated from one another by sawing or breaking.

The advantageous factor in the arrangement shown is that a number of pump radiation sources 2 intersect with different radiation direction in the vertical emission region 1 and that the resonators of all these pump radiation sources are bounded by cavity end facets 4 which consist of split crystal facets and are therefore of high quality. Due to the total reflection, the inner cavity facets 5 necessarily introduced for this purpose do not result in any disadvantageous additional resonator losses. Naturally, the vertical emission region 1, which is quadrilateral in this exemplary embodiment, can also have a different shape of its basic area and, in particular, a hexagonal basic area is conceivable here in which the radiation of the pump radiation sources 2 is in each case incident perpendicularly on one side of the vertical emission region.

Figure 4:
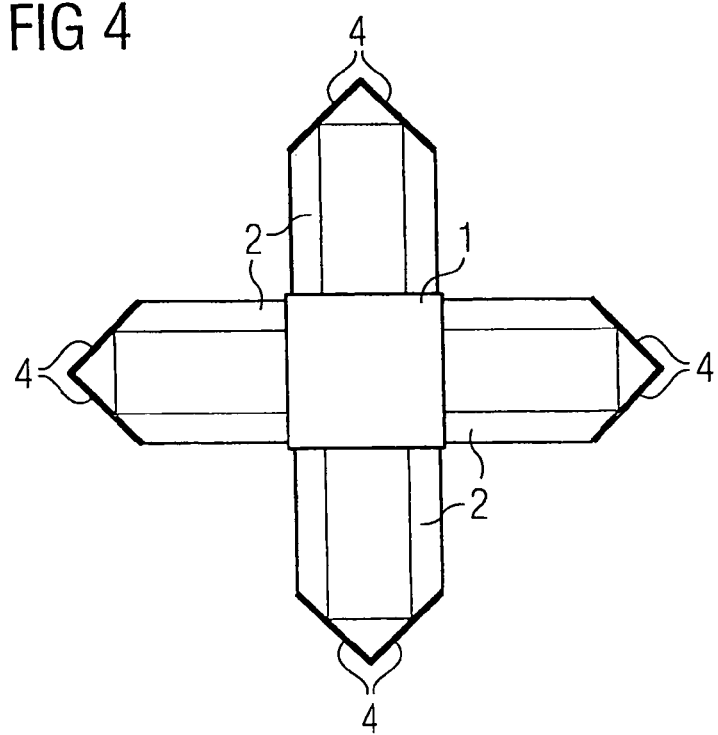
FIG. 4 shows a diagrammatic representation of a top view of a fourth exemplary embodiment of a semiconductor laser device according to the invention.

FIG. 4 shows a fourth exemplary embodiment in which two pump radiation sources 2 intersect in the central vertical emission region 1, which are bounded on each side by in each case two straight cavity end facets 4 located at an angle of 90° to one another.

The arrangement of two cavity end facets 4 in each case is thus analogous to the arrangement of mirrors in a retroreflector.

Similarly to the exemplary embodiment described in connection with FIG. 2, this exemplary embodiment utilizes the total reflection for creating a laser resonator having low reflection losses. The straight cavity end facets 4 can be etched and metallization can be omitted but, if necessary, a protective layer can be provided for passivation.

Figure 5:
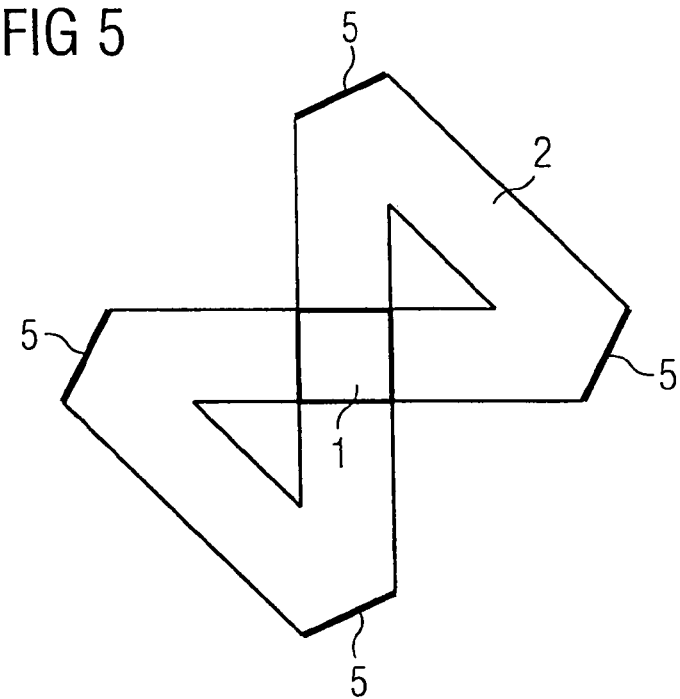
FIG. 5 shows a diagrammatic representation of a top view of a fifth exemplary embodiment of a semiconductor laser device according to the invention and FIG. 6 shows a diagrammatic representation of a top view of a sixth exemplary embodiment of a semiconductor laser device according to the invention.

In the exemplary embodiment in FIG. 5, only one pump radiation source 2 is provided which is equipped with four inner cavity facets 5 as a semiconductor ring laser. The resonator describes the form of an "8", the vertical emission region 1 being arranged at the point of intersection of the "8" in such a manner that radiation is conducted through the vertical emission region 1 from two different directions. The inner cavity facets 5 can be produced in an etching process. In the arrangement shown, the resonator radiation is incident on the inner cavity facets 5 at an angle of 22.5°. Depending on the index of refraction of the semiconductor material used, total reflection also occurs with this angle of incidence. In this case, mirror coating of the areas of the inner cavity facets 5 can be omitted and, if necessary, it can be provided only with a passivation layer. If not, metallization can be applied as reflection coating instead of the passivation layer.

Naturally, any other number of mirrors is also conceivable and advantageous, in particular, if, due to the index of refraction of the semiconductor material used, the angle of incidence of 22.5° produced with four mirrors is not sufficient for meeting the condition for total reflection.

Figure 6:
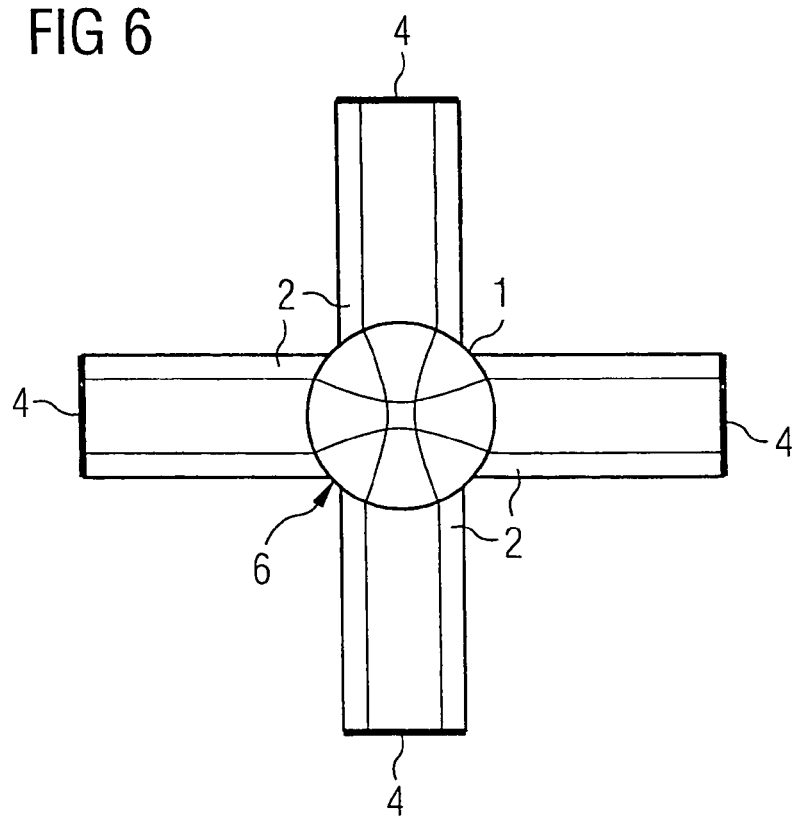

The sixth exemplary embodiment of a semiconductor laser device according to the invention, shown in FIG. 6, is distinguished by a round vertical emission region 1. The vertical emission region 1 is pumped from four sides by two pump radiation sources 2 intersecting in the vertical emission region 1. Vertical emission region 1 and pump radiation sources 2 are designed in such a manner that they have a different index of refraction. This can be done either by the choice of materials or by etching a step into the transition between the vertical emission region 1 and pump radiation source 2 which leads to different impedances in the wave conduction and, as a result, to different effective indices of refraction. On transition of the pump radiation from the pump radiation source 2 into the vertical emission region 1, the pump radiation is subject to refraction towards the center of the vertical emission region 1. In this manner, a radially symmetric distribution of the pump radiation intensity in the vertical emission region 1 is achieved in good approximation which in turn reflects the radial symmetry of the fundamental mode and therefore excites the latter as preferred.

The explanation of the invention by means of the exemplary embodiments is not intended as restriction of the invention to these. Instead, the invention is related to all arrangements having the features mentioned in the claims. Furthermore, the invention comprises all features mentioned in the description and their combination even if these are not explicitly mentioned in the claims or in the description.

The invention claimed is:

1. An optically pumped semiconductor laser device comprising:
    a surface-emitting vertical emission region; and
    monolithically integrated pump radiation sources for optically pumping the vertical emission region,
    wherein the pump radiation sources are set up and arranged in such a manner that the pump radiation enters the vertical emission region in the form of partial bundles of rays of radiation with different radiation directions so that the pump radiation and the fundamental mode of the vertical emission region have an overlap which is suitable for the excitation of this fundamental mode; and
    wherein each of said pump radiation sources has a resonator having at least one cavity end facet arrangement which consists of two straight cavity end facets which are arranged at right angles to one another.

2. The semiconductor laser device as claimed in claim 1, wherein the two straight cavity end facets are arranged in such a manner that the pump radiation is totally reflected on them in the resonator.

3. An optically pumped semiconductor laser device comprising:
    a surface-emitting vertical emission region; and
    monolithically integrated pump radiation sources for optically pumping the vertical emission region,
    wherein the pump radiation sources are set up and arranged in such a manner that the pump radiation enters the vertical emission region in the form of partial bundles of rays of radiation with different radiation directions so that the pump radiation and the fundamental mode of the vertical emission region have an overlap which is suitable for the excitation of this fundamental mode; and
    wherein one or more of the pump radiation sources have a folded resonator with two cavity end facets and at least one inner cavity facet.

4. The semiconductor laser device as claimed in claim 3, wherein the at least one inner cavity facet is arranged in such a manner that the pump radiation is totally reflected on it in the resonator.

5. The semiconductor laser device as claimed in claim 3, wherein the cavity end facets are broken crystal facets and the inner cavity facets are etched facets.

6. An optically pumped semiconductor laser device comprising:
    a surface-emitting vertical emission region; and
    at least one monolithically integrated pump radiation source for optically pumping the vertical emission region,
    wherein the at least one pump radiation source is set up and arranged in such a manner that the pump radiation enters the vertical emission region in the form of partial bundles of rays of radiation with different radiation directions so that the pump radiation and the fundamental mode of the vertical emission region have an overlap which is suitable for the excitation of this fundamental mode; and wherein the transition from the at least one pump radiation source to the vertical emission region is curved and is distinguished by a change in the index of refraction so that the pump radiation is focused in the vertical emission region.

7. The semiconductor laser device as claimed in claim 6, wherein the radiation of the pump radiation source is conducted through the vertical emission region several times in different directions.

* * * * *